US010823760B2

(12) United States Patent
Todd, II et al.

(10) Patent No.: US 10,823,760 B2
(45) Date of Patent: Nov. 3, 2020

(54) APPARATUS, SYSTEM AND METHOD FOR SECURING AN ENCLOSURE

(71) Applicant: DeWalch Technologies, Inc., Houston, TX (US)

(72) Inventors: Tyler Dean Todd, II, Houston, TX (US); Donald Mark DeWalch, Houston, TX (US); James Michael Holcomb, Houston, TX (US); Aditya Kumar Palthi, Houston, TX (US)

(73) Assignee: DeWalch Technologies, Inc, Houston, TX (US)

( * ) Notice: Subject to any disclaimer, the term of this patent is extended or adjusted under 35 U.S.C. 154(b) by 0 days.

(21) Appl. No.: 13/751,136

(22) Filed: Jan. 27, 2013

(65) Prior Publication Data
US 2014/0213090 A1    Jul. 31, 2014

(51) Int. Cl.
*H01R 13/62*    (2006.01)
*G01R 11/04*    (2006.01)

(52) U.S. Cl.
CPC .................... *G01R 11/04* (2013.01)

(58) Field of Classification Search
CPC ...................................... G01R 11/04
USPC ............. 439/301, 508, 517; 292/327, 256.6, 292/256.67; 70/164, 232; 361/659, 361/664–667
See application file for complete search history.

(56) References Cited

U.S. PATENT DOCUMENTS

| 1,587,754 | A | * | 6/1926 | Brune, Sr. | G09F 3/0352 292/317 |
| 3,221,216 | A | * | 11/1965 | Kobryner | 361/704 |
| 4,611,478 | A | * | 9/1986 | Carlson et al. | 70/164 |
| 5,752,296 | A | * | 5/1998 | Chaput | H01R 13/635 24/268 |

(Continued)

OTHER PUBLICATIONS

ISR and Written Opinion for International Application No. PCT/US2013/023349 filed Jan. 27, 2013 (10 pages).

(Continued)

*Primary Examiner* — Edwin A. Leon
(74) *Attorney, Agent, or Firm* — DeWalch Technologies, Inc.

(57) ABSTRACT

The present invention relates to an apparatus and method for securing a box cover to a watthour meter socket box and relates to an apparatus, a system including a ring and fracturable locking system, in some embodiments, and method for securing a watthour electrical meter to a socket meter box. A locking sealing ring includes at least an annular band, wherein a body portion of the annular band includes at least a first band portion and a second band portion, and wherein the first band portion includes at least a first ring end and the second band portion includes at least a second ring end. A first tab is disposed on the first ring end and includes at least a connector member. A second tab is disposed on the second ring end with the second tab including at least a receiver member, and wherein the connector member is adapted for connection with the receiver member. A fracturable retainer is provided including at least a body defining a passageway therethrough, wherein the passageway is configured to receive at least a portion of the first and second tabs, and wherein the fracturable retainer is adapted to inhibit access to at least the connector.

4 Claims, 22 Drawing Sheets

(56) References Cited

U.S. PATENT DOCUMENTS

| | | | | |
|---|---|---|---|---|
| 6,059,605 | A * | 5/2000 | Robinson et al. | 439/517 |
| 6,406,074 | B1 * | 6/2002 | Mahaney | 292/327 |
| 6,439,010 | B1 * | 8/2002 | Julicher | 70/164 |
| 6,752,652 | B1 * | 6/2004 | Robinson | 439/517 |
| 2015/0027176 | A1 * | 1/2015 | Todd, II | E05B 65/0089 70/167 |
| 2015/0323563 | A1 * | 11/2015 | Todd, II | G01R 11/04 24/484 |

OTHER PUBLICATIONS

International Application No. PCT/US2013/023349 filed Jan. 27, 2013 (3 pages).
International Preliminary Report on Patentability dated Oct. 23, 2015 for PCT International Application No. PCT/US13/23349 filed Jan. 27, 2013 (five (5) pages).
E-mails dated Jul. 23, 2015 through Jul. 30, 2015 between Applicant and Foreign Counsel (Becerril, Coca & Becerril) regarding Mexican Institute of Industrial Property (MIIP) Mexican Application No. MX/A/2015/009692) (eight (8) pages).
E-mail dated Dec. 14, 2015 from Foreign Counsel (Becerril, Coca & Becerril) regarding Mexican Institute of Industrial Property (MIIP) Mexican Application No. MX/A/2015/009692) (two (2) pages).
U.S. Appl. No. 14/763,800, filed Jul. 27, 2015 (two (2) pages).
U.S. Appl. No. 14/763,800 (3 pages).
Non-Final Rejection dated Jun. 30, 2016 in connection with U.S. Appl. No. 14/763,800 (8 pages).
Applicant's Response with Amendment dated Dec. 30, 2016 in connection with U.S. Appl. No. 14/763,800 (15 pages).
Final Rejection dated Jan. 6, 2017 in connection with U.S. Appl. No. 14/763,800 (9 pages).
Applicant's RCE including Amendment and Suspension dated May 8, 2017 in connection with PAT-075 PCT U.S. Appl. No. 14/763,800 (21 pages).
Non-Final Rejection dated Sep. 20, 2017 in connection with U.S. Appl. No. 14/763,800 (9 pages).
Applicant's Response with Amendment dated Feb. 20, 2018 in connection with U.S. Appl. No. 14/763,800 (16 pages).
Final Rejection dated Jun. 25, 2018 in connection with U.S. Appl. No. 14/763,800 (8 pages).
Applicant's RCE with Amendment and Suspension dated Dec. 26, 2018 in connection with U.S. Appl. No. 14/763,800 (19 pages).
Notice of Allowance dated May 6, 2019 in connection with U.S. Appl. No. 14/763,800 (6 pages).
Notice to File Corrected Application Papers dated Jun. 20, 2019 in connection with U.S. Appl. No. 14/763,800 (3 pages).
Applicant's RCE with IDS dated Aug. 6, 2019 in connection with U.S. Appl. No. 14/763,800 (49 pages).

* cited by examiner

APPARATUS, SYSTEM AND METHOD FOR SECURING AN ENCLOSURE

BACKGROUND OF THE INVENTION

The present invention relates generally to a securing apparatus, and more specifically, it relates to a securing apparatus for securing at least one structure or a plurality of structures and may be used to secure a utility service enclosure, or for example, a watthour meter socket box to prevent unauthorized access.

In the electric utility industry, for example, a locking apparatus or seal is useful to secure access panels of enclosures containing electrical or metering equipment. Such a locking apparatus or seal also ideally includes tamper-evident features to indicate unwanted tampering with the seal or attempts to access a secured electrical meter box or the like.

Electrical service providers generally deliver electricity to their customers via power lines buried underground or distributed along poles or towers overhead. The provider's power lines are usually distributed from a power generation station to numerous sets of customer lines, so that customers can then use the power to satisfy their various electrical needs. To measure delivered power so that customers can be billed in proportion to their usage, service providers typically terminate their power lines at a customer's home or business facility through a metered socket box, various designs for which are well known.

A meter box is generally used by electric utility companies, however the invention herein may be used with other utility service enclosures in the gas, water, cable, TV utility industries, or in shipping or other industries as well.

An example of one previously known meter box consists of two sets of electrical posts, with a provider's transmission lines being connected to one set of posts, and the customer's service lines to the other set. In order to measure the amount of electricity a customer uses, the meter box is configured to accept a watt-hour meter or another electricity usage measurement device, which, when plugged into the socket box, permits transmission of electricity from the provider to the customer and allows the amount of transmitted electricity to be accurately measured, so that the provider can charge the customer for power usage at an appropriate rate.

Various designs and uses for watthour meters are also well known, and all such designs and uses are incorporated by reference into the teachings of the present invention. The present invention is also applicable in situations where the customer's service lines are routed from the meter box to a breaker box so that electricity can be distributed to multiple service locations using additional sets of electrical lines or wires.

Presently, there are various types of meter socket boxes, each distinguished by the manner in which the meter is secured in place once it has been plugged into an electrical socket disposed in the meter box. For example, in FIG. 1a, a ringed-type meter box 6A fitted with a flanged 6B front cover 6D is known, within which a watthour meter 6F is disposed so that a head portion of the meter passes out through a flanged opening 6C in the front cover. In this configuration, the meter is generally held in place using an annular, lockable sealing ring (not shown) to secure the complementary mounting flange 6E disposed on the meter base so as to form a watthour meter and meter box cover flange combination. However, with this type of design and certain locking devices, high lock cost and operator "key control" may be a potential problem. Moreover this type of design may require the use of special tools and structures to secure a ring locking device and may require used of more than one hand to retain or engage the locking device. It should be noted that there are different types of these locks; most of which require a key in order to engage and disengage the sealing ring from the meter and base; this type of lock can be "locked" and "unlocked" multiple times.

In an attempt to overcome some of these shortcomings, there have been certain keyless, destructible devices, that can be installed on ring-type meter socket boxes. For example, a common device is directed toward a locking pin and housing assembly for locking together structures such as a watthour meter to a mounting flange of a watthour meter box. The housing is typically adapted to receive and permanently lock a portion of the locking pin in the housing, with a portion of the assembly adapted to be fractured and removed from the remaining portion of the assembly such that the assembly may be removed from the structures. Other example devices comprise two ring ends having interconnecting structures with one ring end including, for example, a tab member and the other ring end including and aperture adapted to receive the tab member to interconnect the ring ends. The tab member also forms an opening adapted to receive a frangible wire seal tab or the like. After the ring ends are interconnected, the wire seal tab may be inserted through the tab member opening and secured. With this configuration, breaking or cutting the frangible wire seal tab would provide evidence that the device had been tampered with. However, these securing devices do not sufficiently inhibit access to the interconnecting structures and are relatively easy to defeat. Other include multiple components or complex parts which reduce the cost-effectiveness of such devices.

(It should be noted that any information referred to above or herein is not intended to constitute an admission that such information is in fact "material" or "prior art" for the present invention unless specifically designated as such).

There remains a need for a low-cost, but more secure, locking apparatus, system and method for securing at least one structure or a plurality of structures, used with a utility service enclosure, or for example, a meter box locking ring having, for example, flanged ends or used to seal for example, utility enclosures, meter boxes or trucking, shipping, airline or other transportation containers or enclosures. There is also a need for a tamper-evident locking apparatus that is adapted to readily indicate tampering. There is a further need for a locking or securing device that can be "locked" without the need for special tools and "unlocked" only one time by using a special or complementary tool, such that when the locking apparatus is "unlocked," it is rendered ineffective as a future locking device. There is a further need for a locking or securing device that may be retained or engaged using one hand.

Those of skill in the art will appreciate the example embodiments of the present invention which addresses the above needs and other significant needs the solution to which are discussed hereinafter.

SUMMARY OF THE INVENTION

The present invention relates to an apparatus and method for securing a box cover to a watthour meter socket box and relates to an apparatus, a system including a ring and fracturable locking system, in some embodiments, and method for securing a watthour electrical meter to a socket meter box. A locking sealing ring comprises an annular band, wherein a body portion of the annular band comprises a first band portion and a second band portion, and wherein the first band portion comprises a first ring end and the second band portion comprises a second ring end. A first tab is disposed on the first ring end and comprises a connector member. A second tab is disposed on the second ring end with the second tab comprising a receiver member, and wherein the connector member is adapted for connection with the receiver member. A fracturable retainer is provided comprising a body defining a passageway therethrough, wherein the passageway is configured to receive at least a portion of the first and second tabs, and wherein the fracturable retainer is adapted to inhibit access to at least the connector. An example embodiment comprises a band, fracturable retainer, and breaking tool. Another embodiment of the present invention is to provide a locking assembly that can be removed with a special lock removal tool. In another embodiment, the fracturable retainer is adapted to indicate evidence of tampering with the fracturable retainer. In another embodiment, the fracturable retainer comprises an outer surface adapted to receive at least one fracturing force by an external object and wherein the fracturable retainer further comprises a region adapted to fracture in response to the at least one fracturing force. In another embodiment, the fracturable retainer may be removed from the annular band after fracturing. In another embodiment, the fracturing force ranges from 200 to 2500 pounds. In another embodiment, the region comprises at least a display member. In another embodiment, the display member (marking face) is adapted to indicate evidence of tampering with the fracturable retainer.

The content and disclosure of each of the following applications/publications are specifically hereby incorporated by reference: U.S. patent application Ser. No. 11/698,616, U.S. patent application Ser. No. 12/082,122 and U.S. patent application Ser. No. 13/033,544.

These and other aspects, features, and advantages of example embodiments of the present invention will become apparent from the drawings, the descriptions given herein, and the appended claims. Further aspects are also indicated herein in various example embodiments of the invention. However, it will be understood that the above-listed aspects, objectives and/or advantages of example embodiments are intended only as an aid in quickly understanding aspects of the example embodiments, are not intended to limit the embodiments of the invention in any way, and therefore do not form a comprehensive or restrictive list of aspects, objectives, and/or features, and/or advantages.

There has thus been outlined, rather broadly, features of example embodiments of the invention in order that the detailed description thereof may be better understood, and in order that the present contribution to the art may be better appreciated. There are additional features of example embodiments of invention that will be described hereinafter.

In this respect, before explaining at least one example embodiment of the invention in detail, it is to be understood that the example embodiments are not limited in its application to the details of construction and to the arrangements of the components set forth in the following description or illustrated in the drawings. Various example embodiments are capable of other further embodiments and of being practiced and carried out in various ways. Also, it is to be understood that the phraseology and terminology employed herein are for the purpose of the description and should not be regarded as limiting.

To the accomplishment of the above and related aspects, example embodiments of the invention may be embodied in the form illustrated in the accompanying drawings, attention being called to the fact, however, that the drawings are illustrative only, and that changes may be made in the specific construction illustrated.

BRIEF DESCRIPTION OF THE DRAWINGS

The drawings as noted below form part of the present specification and are included to further demonstrate certain aspects of example embodiments of the invention. Various other aspects, features and attendant advantages of the embodiments of the invention will become fully appreciated as the same becomes better understood when considered in conjunction with the accompanying drawings, in which like reference characters designate the same or similar parts throughout the several views, and wherein.

DETAILED DESCRIPTION OF THE INVENTION

Figure 1:
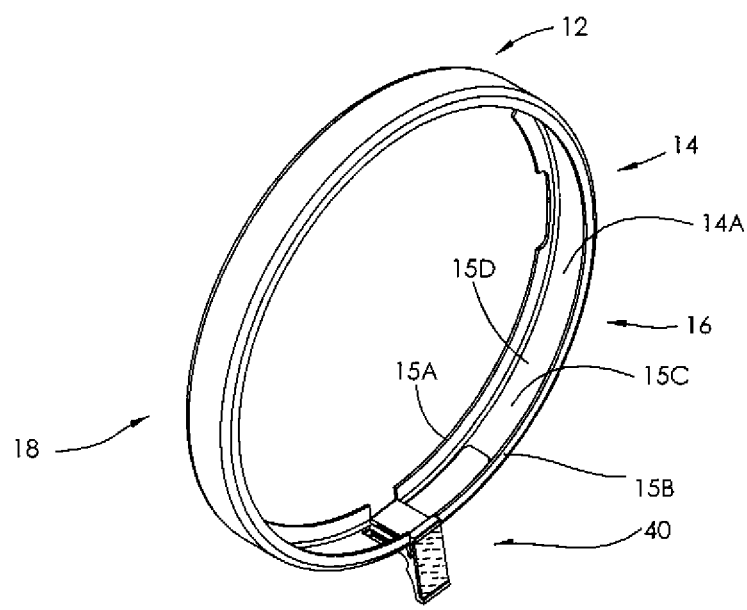
FIG. 1 is a perspective view of the band assembly, in the "locked" position

Turning now descriptively to the drawings, in which similar reference characters denote similar elements throughout the several views, the attached figures illustrate an apparatus for securing a plurality of structures or a portion of a utility service enclosure. For example, in one embodiment, the apparatus is used for securing a watthour meter socket ring so as to prevent the separation of two opposing members of the watthour meter socket box ring. The apparatus may be used for creating a tamper-evident seal by securably connecting a plurality of structures. The apparatus may also be used as a locking assembly with at least one structure as will hereinafter be explained in further detail.

According to a specific, non-limiting embodiment of the invention, and referring now to FIGS. 1-5c, an apparatus for securing a watthour electrical meter to a socket box cover comprises an annular band 14. The annular band 18 comprises a body portion comprising a first band portion 16 and a second band portion 18. The first band portion comprises a first ring end 20 and the second band portion comprises a second ring end 22.

Figure 3A:
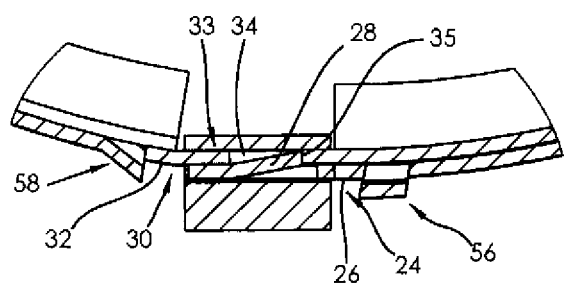
FIG. 3a is a cross sectional view of the band assembly in the locked position
Figure 3B:
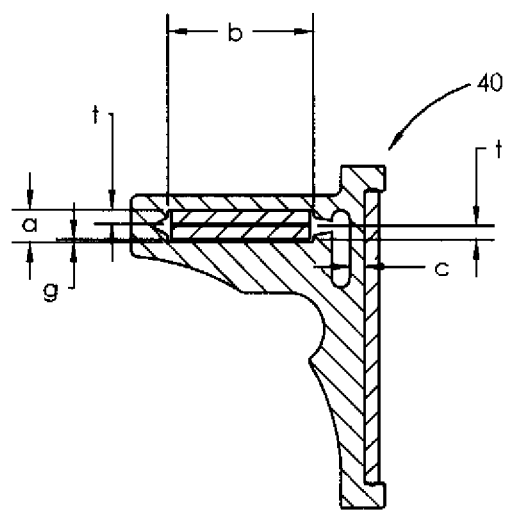
FIG. 3b is a cross sectional view of the band assembly in the locked position

In an exemplary embodiment, a first tab 24 is disposed (formed from, attached, or the like) on the first ring end 20. The first tab comprises a connector member 26. In a non-limiting example embodiment, the connector member comprises a catch 28 as shown in FIGS. 3-4b. In other embodiments, the connector member may include other types of fastening or connectors known to persons of ordinary skill in the art. For example, in a non-limiting embodiment, the connector may include various well known connectors (e.g., fastener, barrel lock; mating sharkteeth)

Referring now to FIGS. 3a-3b and 5a-5c, in an example embodiment, a second tab 30 is disposed (or formed from, attached, and the like As noted herein) on the second ring end 22. The second tab comprises a receiver member 32 for receiving the connector member 2. The connector member is adapted for connection with the receiver member. In an example embodiment, the connector member is adapted for connection with the receiver member to form a releaseable connection. In a non-limiting example embodiment, the receiver member 32 comprises a region 33 of the second tab wherein the region defines a receiving aperture 34 for receiving the catch 28.

Referring now to FIGS. 1-6s, example embodiments of a retainer are illustrated. It should be noted that in some embodiments the retainer is not adapted for fracturing. In other embodiments, for example as shown in FIGS. 6a-6b, a fracturable retainer 40 is shown, Further embodiments are shown in FIGS. 1, 2a-2b, and 6b-6e. The fracturable member 40 comprises a body 42 defining a passageway 44 therethrough, wherein the passageway is configured to receive at least a portion of the first and second tabs 24, 30, and wherein the fracturable retainer is adapted to inhibit access to at least the connector member 26 or receiver member 32.

Figure 5A:
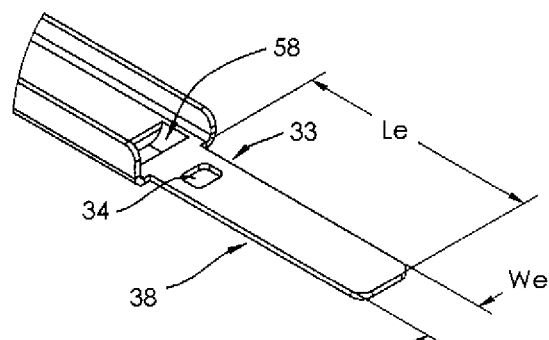
FIG. 5a is a perspective view of the second tongue of the band
Figure 5B:
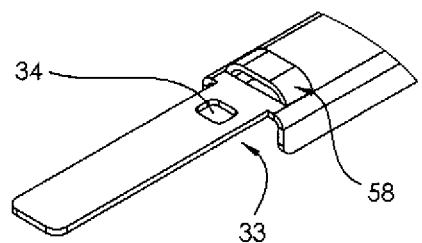
FIG. 5b is another perspective view of the second tongue of the band
Figure 5C:
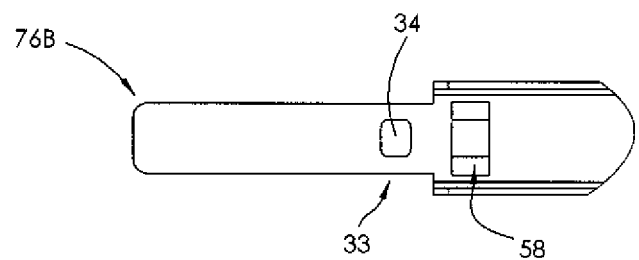
FIG. 5c is a top view of the second tongue of the band

It should also be noted that the fracturable retainer is adapted to be readily mounted to the annular band by inserting the first tab into the passageway from one side of the fracturable retainer and then inserting the second tab into the other side of the passageway. It will be appreciated that the second tab, in an example embodiment comprises an elongated member 38, having length designated by Le as shown in FIG. 5a. The elongated member also facilitates aligning and mounting the fracturable retainer on the annular band. In this way, the retainer may be mounted to the annular band to form a unitary configuration to facilitate packaging, shipping, handling, and installing the annular band on a meter. Also, the first and second tabs are curved and configured to overlap one another in a circumferentially stacked configuration to generally conform to the annular shape of the band. They may also be configured, and in some embodiments, biased, so as to overlap one another to facilitate alignment and connecting the connector member and receiving member which also enables securing the connection therebetween when the retainer is slid in position over the connection in order to maintain same and prevent, for example in an example embodiment, the catch from releasing from the aperture. FIG. 3 shows the retainer in a retention mode securing the releaseable connection between the connector member and receiving member. In addition, it should be noted that the elongated member has a width, designated by We, adapted to foster alignment of the first band portion with the second band portion. In an example embodiment, the first and second band portions have a u-shaped cross section comprised of a first and second walls and band 15A, 15B, 15C which form a channel 15D. Such a configuration, fosters guiding the elongated member along the channel as the circumference of the annular band is enlarged and reduced to fit on a meter band.

Figure 5D:
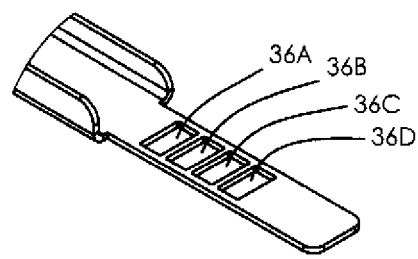
FIG. 5d is an alternative embodiment perspective view of the second tongue of the band
Figure 5E:
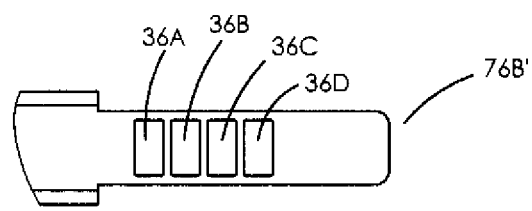
FIG. 5e is an alternative embodiment perspective view of the second tongue of the band

In addition, the first and second tab may comprise at least one connector member and receiver member respectively and in an example embodiment may comprise at least one catch and at least one receiving aperture. For example, in an example embodiment as shown in FIGS. 5d-5e, the second tab may comprise a plurality of receiving apertures 36A-36D. With such a configuration, the annular band may be adjusted to tighten or loosen the fit around the securing metal band 6E, shown in FIG. 1a, of a watthour meter 6F and the meter box mounting flange 6B. To mount a band having an adjustable configuration, the band would first be expanded to its largest circumference. The band ends would then be slowly forced together to make the band progressively smaller (by continuing to push the catch past the successive apertures 36A-36D) until the appropriate size is achieved (other embodiments include a fastener receiver, barrel lock housing; a lug receiver) (e.g., formed through a body portion of said first tab; comprising a receiving aperture).

Figure 4A:
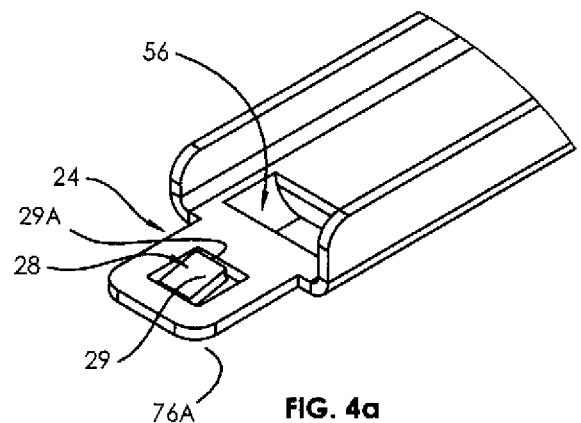
FIG. 4a is a perspective view of the first tongue of the band
Figure 4B:
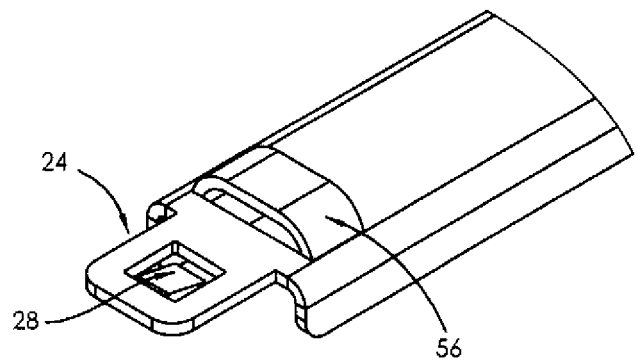
FIG. 4b is another perspective view of the first tongue of the band
Figure 4C:
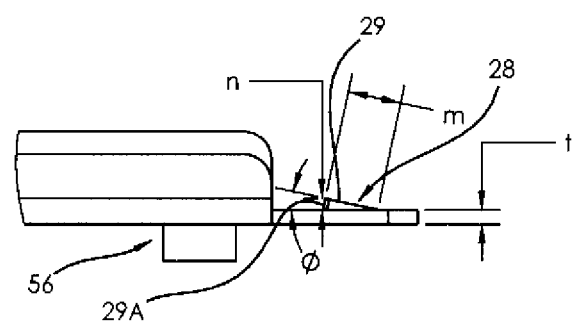
FIG. 4c is a side view of the first tongue of the band

Referring in particular now to FIGS. 3, 4a-4c and 5a-5c, in a non-limiting example embodiment, the catch 28 is configured to lie in a plane having an orientation inclined toward the center of the annular band; the catch orientation aids in preventing access to and tampering with the catch 28. For example, such a configuration helps prevent tampering and prevent unwanted access to the interior passageway of the fracturable retainer. As shown in FIGS. 4a-4c, the first tab 24 comprises catch 28 which comprises a raised surface 29. The height to which the surface 29 is raised above the tab 24 is equivalent to the thickness of the tab 24. In some embodiments, the tab is formed contiguously from the annular band material (e.g., metal, explained further hereinafter) and the thickness of the tab is the same as that of the body 14A of the annular band 14. In other embodiments, the first and second tabs may be attached by welding, fastening, riveting and other various means and methods known to a person of ordinary skill in the art. The catch 28 is designed with elasticity to ensure spring back to its inclined orientation after release from the aperture 34. The ratio of the height of the raised surface, designated by "n", to length of the raised surface, designated by "m", is sine φ where "φ" is the angle of inclination of the catch as indicated in the following formula: $0.166 < \text{sine } \varphi < 0.333$ In an example embodiment, as shown in FIGS. 4a-4c and 5a-5c, the first tab has a catch 28 and a catch stop 29A. The second tab 30 forms a receiving aperture. In the example embodiment shown in FIGS. 5a-5c, the region 33 around the aperture 34 is dimensioned to withstand approximately 1000 lbs of tensile force. Alternate embodiments could be configured to enlarge the structure around the aperture in region 33 to increase or decrease this value depending on the application.

Figure 6A:
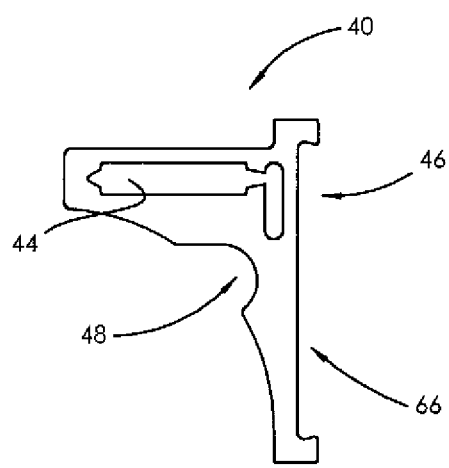
FIG. 6a is a side view of the retaining member
Figure 6B:
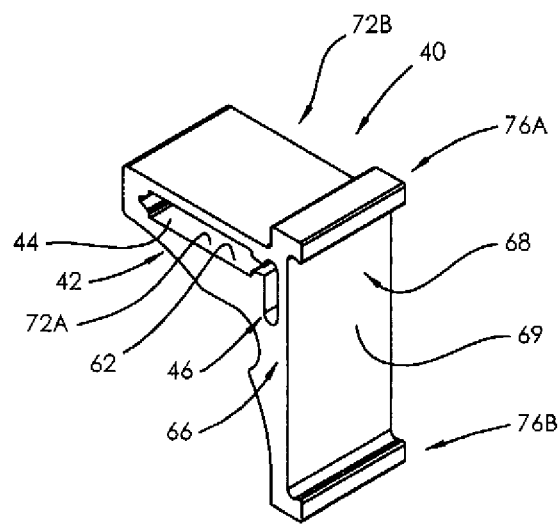
FIG. 6b is another perspective view of the retaining member

In the example embodiment shown in FIGS. 6a-6b, the fracturable retainer 40 comprises a body forming the passageway 44, which in some embodiments substantially surrounds or encapsulates the mating area including at least the connection between catch 28 and aperture 33 of the first and second tabs. The fracturable retainer 40 further comprises a stress concentrating member 46, to be explained further herein, which aids in fracturing and destruction of the fracturable retainer in order to unlock the annular band.

The fracturable retainer 40 is adapted to hold or secure the connection between 28 and 34 so as secure the two ring ends 20, 22 together. However, it also should be recognized that the raised surface 29 of catch 28 and aperture 33 are selectively located such that when a connection is made therebetween, the retainer 40 is, in some embodiments, snuggly secured between the ring ends so as to prevent access to the passageway and unwanted tampering 15 in the first tongue 13 and the catch 14 in the second tongue 16 are located accordingly.

In addition, in an example embodiment, the fracturable retainer is captured between the first and second ends 20, 22 of the annular band. For example, as shown in the FIGS. 1-5c, the annular band comprises first and second protuberances 56, 58, in an embodiment, proximal the end of the ring ends. In some embodiments, the protuberances are raised surfaces formed from the ring material or lances and serve the purpose of protecting the fracturable retainer 40 from tampering.

In one example embodiment when mounting the fracturable retainer 40, the fracturable retainer 40 is first inserted on to the first tab 24 of the band and then the second tab 30 is inserted into passageway 44 of the fracturable retainer 40 such that it rides along the inner surface 15B of the annular band 14. The second tab is forced against and flexes the catch 28 of the first tab in order to pass through the fracturable retainer until the raised surface 29 and stop 29A of the catch 28 reaches the aperture 34, wherein the catch stop 29 mates with the inner wall 35 of the aperture 34 thus forming the locking connection and securing the annular band.

The dimensions of the fracturable retainer passageway 44, in an example embodiment are configured and set in such a way that upon encapsulation, the interior surface of the passageway does not allow disengagement of the mated catch and aperture. In an example embodiment, the dimension of the gap, designated by "g", is configured to provide suitable looseness to enable some free movement of the first and second tabs with respect to the fracturable retainer, but must be minimized to inhibit tampering. This is represented by the following formula: $a = 2t + g$ where $g = 0.25t$ approximately; $b = 1.05$ (width of the tongue). In other embodiments, the range of g is $0.1t$ to $0.5t$.

Figure 6C:
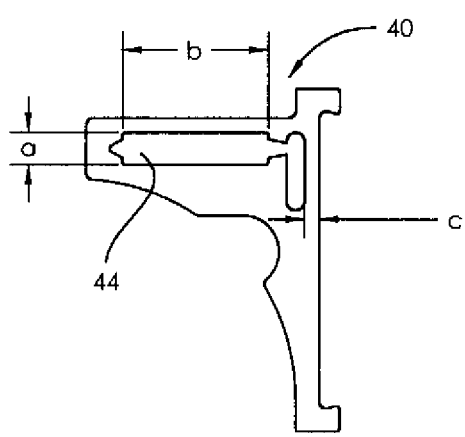
FIG. 6c is another side view of the retaining member FIG. 6d-6s perspective views of alternate versions of the retaining members
Figure 6D:
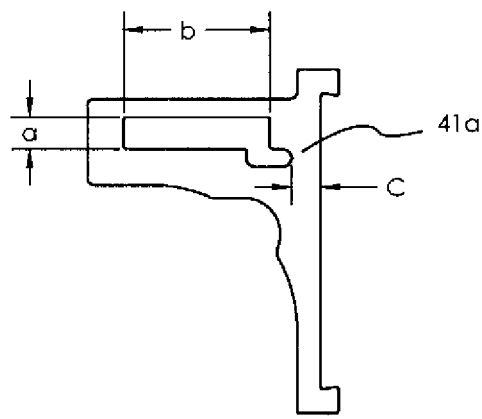
FIG. 6q is a front view of the destroyed retaining member
FIG. 6r is a perspective view of the destroyed retaining member
FIG. 6s is a perspective view of the assembly of retaining member and identification data protector
Figure 6E:
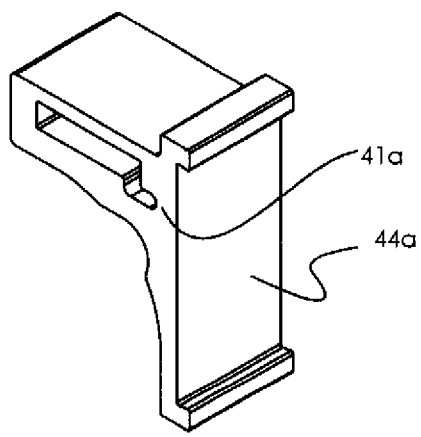
Figure 6F:
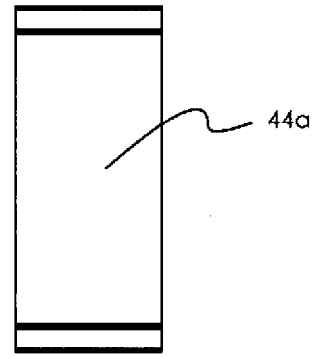
Figure 6G:
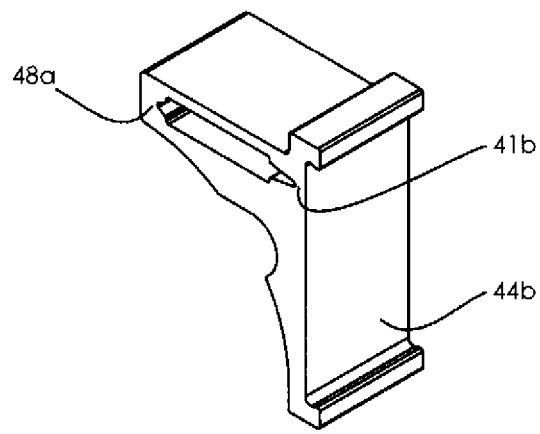
Figure 6H:
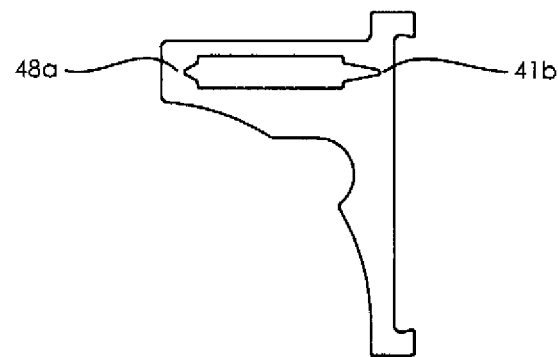
Figure 6I:
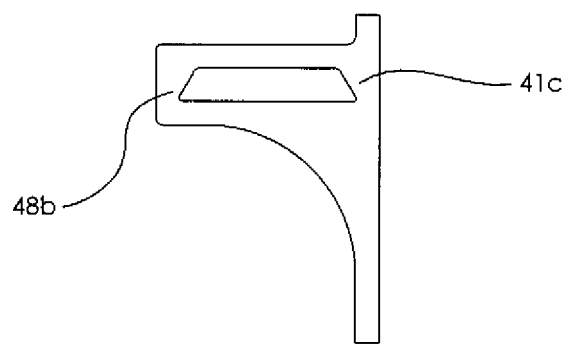
Figure 6J:
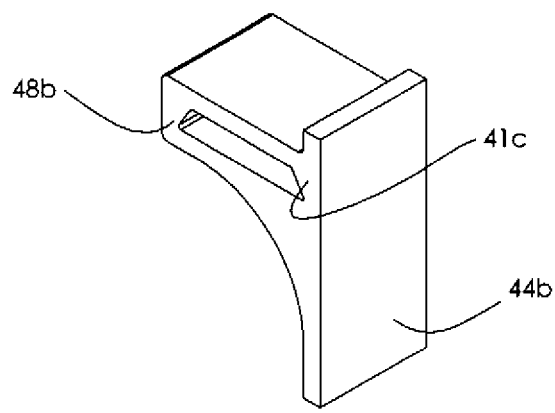
Figure 6K:
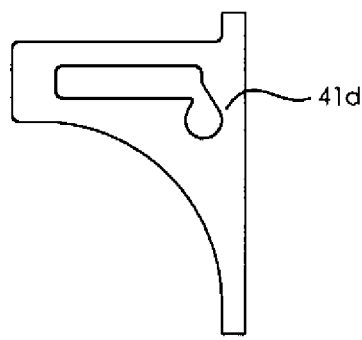
Figure 6L:
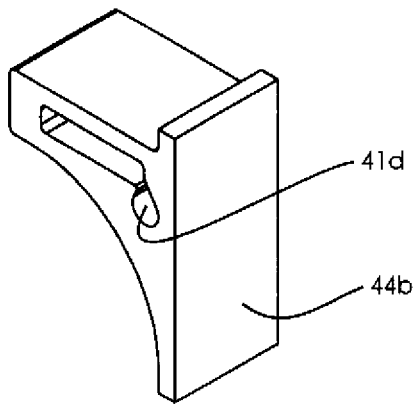
Figure 6M:
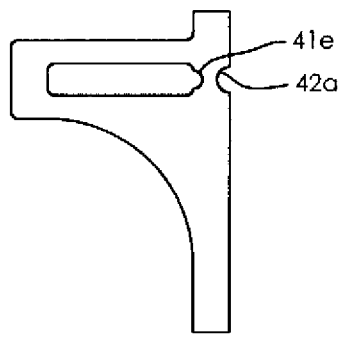
Figure 6N:
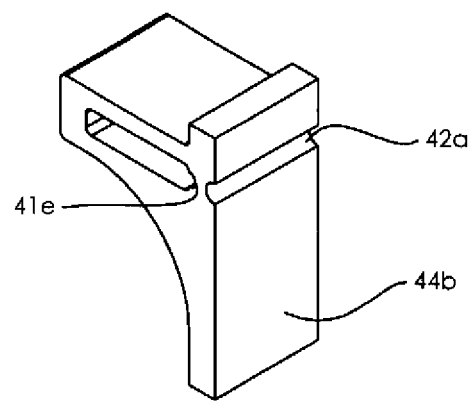
Figure 6O:
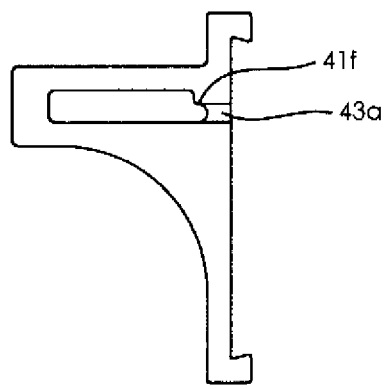
Figure 6P:
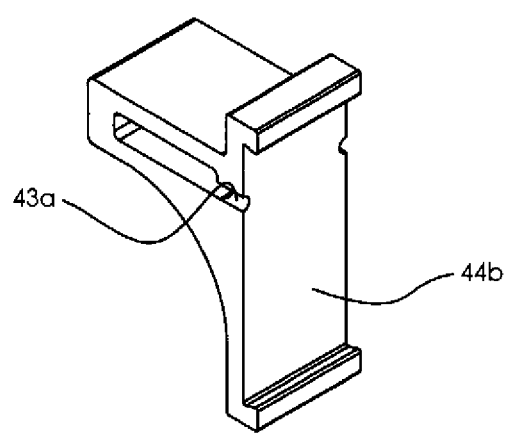

In an example embodiment shown in FIGS. 6a and 6b, the fracturable retainer 40 further comprises a stress-concentrating member 46 to concentrate stress at a desired location on the body of the fracturable retainer, wherein there is minimal material elongation, represented by "a", in FIG. 6c, thereby minimizing the ability of tampering to increase the space between the annular band and fracturable retainer. In this way, the retainer will fracture, showing tamper evidence, rather than deform in an undesirable manner such that someone tampering with retainer could disconnect the catch and aperture connection and remove the locking sealing ring 12 from the meter and flange 6b shown in FIG. 1a.

In an example embodiment shown in FIGS. 6a and 6b, the fracturable retainer is adapted to indicate evidence of tampering with the fracturable retainer. For example, the fracturable retainer comprises an outer surface 66 adapted to receive at least one fracturing force by an external object, such as in one example embodiment a tool (see FIGS. 9-11, item 200, 300) explained further hereinafter, and wherein the fracturable retainer further comprises a region 68 adapted to fracture in response to the at least one fracturing force. In some embodiments the fracturing force ranges from 200 to 2500 pounds depending on the application. However, in other embodiments the fracturable retainer may be configured to fracture when subject to a force lower or higher than the above range. In an exemplary embodiment, the region 66 comprises at least a display member 69. The display member (or marking face) is adapted to indicate evidence of tampering with the fracturable retainer. In an example embodiment the display member is configured to display identifying markings. The identifying markings or (marking indicia) may comprise, for example, a bar code; color coding, written text, color, or images (for example, see FIGS. 6q and 6r, item 44b and FIGS. 6a-6s, generally). It should be noted that fracturing or breaking the fracturable retainer (or surrounding member in some embodiments) destroys the identifying markings (for example, see FIGS. 6q and 6r, item 44b1 and for example, and FIGS. 6a-6s, generally). In other embodiments the display member comprises a marking surface. In addition, the display member may comprise a marking face adapted to indicate evidence of tampering with the fracturable retainer, wherein the fracturable retainer is adapted to fracture across at least part of the marking face so as to show evidence of tampering. In some embodiments, the color or color-coding and material comprises an anodized (e.g., colored) surface or an embossed label. As noted, the fracturable retainer is adapted to fracture across at least part of a face of the fracturable retainer so as to show evidence of tampering.

In another embodiment, the fracturable retainer (or retaining member, if not configured to be fracturable) comprises at least one side 72A, 72B forming a guiding surface (not shown) into the passageway to facilitate guiding a distal end 76A (see FIGS. 4a, 5a), of the first tab 24' or a distal end 76B (or 76B' in an alternate embodiment) of the second tab into the passageway. The guiding surface in some embodiment has an arcuate surface to foster self-alignment of the tabs into the retainer.

Figure 6Q:
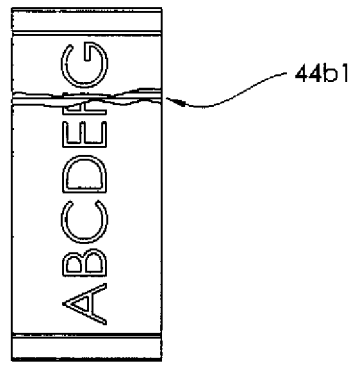
Figure 6R:
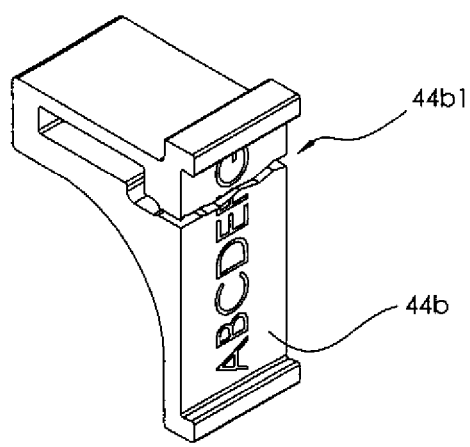
Figure 6S:
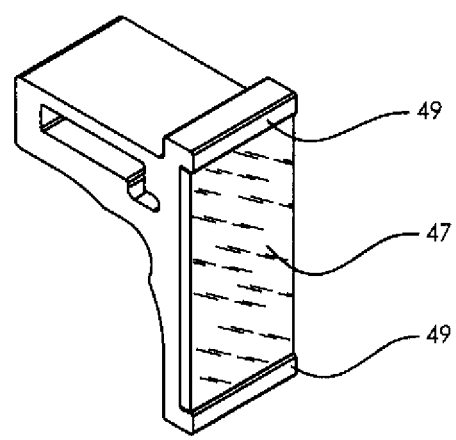

In an example embodiment shown in FIGS. 6a-6s, wherein the passageway is configured to align the connector member 26 for connection with the receiver member 32 when urged together and wherein the fracturable retainer is adapted to maintain the connection until the fracturable retainer is fractured and removed.

In an example embodiment shown in FIGS. 3a-3b, the fracturable retainer 40 comprises an unfractured mode wherein the fracturable retainer 40 is adapted to maintain the connection and a fractured mode (such as in FIG. 6r) wherein the fracturable retainer is fractured and adapted to be removed from the connection, such that the connection is releaseably retained. It should also be recognized, that fracturable retainer is separable from the annular band in an unfractured mode, prior to locking and capturing the retainer between the ring ends as noted. The fracturable retainer must be destroyed to disengage the connector member and the receiver member (catch tab and receiving aperture).

In other example embodiments, a complementary tool is adapted to engage the outer surface of the fracturable retainer, wherein a fracturing force may be applied to break and the fracturable retainer. In other embodiments, the complementary tool is adapted to engage the outer surface of the fracturable retainer (see FIGS. 6a-6c), wherein a fracturing force may be applied to break and the fracturable retainer to induce stress upon the retainer (or surrounding member in some embodiments) stress concentrating member 46 to cause fracture and disengagement of catch tab and receiving aperture.

In an example embodiment, the fracturable retainer comprises and outer surface 66 (and 48) having an engageable region, and wherein the complementary tool comprises a locating member adapted to mate with the engageable region of the fracturable retainer. In another example embodiment, the fracturable retainer comprises and outer surface having an engageable region, wherein the complementary tool comprises a locating member adapted to mate with the engageable region of the fracturable retainer, wherein the complementary tool may be adapted to engage the outer surface of the fracturable retainer, wherein a fracturing force may be applied to break the fracturable retainer. The tool is configured with a locating member that mates with a complementarily-configured region formed on the surrounding member to properly locate cutting surface with surround member stress concentrating feature. The tool is engages with the retainer or surrounding member to induce stress upon surrounding member stress concentrating feature to cause fracture and disengagement of catch tab and receiving aperture.

In another exemplary embodiment, breaking tools are provided. The tools can all utilize the retainer alignment member 48 formed into the backside of the retainer (see FIG. 6a) with a cooperating feature on tool to locate and hold part during operation. Cutting blades are comprised of tool steel but may be stainless or other alloy capable of holding a cutting edge through many operations. Forces acting upon retainer required to cause breakage depend upon part material and geometry of the stress concentrating member and feature but can range from 200-2500 pounds. Forces are thus controlled and determined appropriate for application. The tools are manual and work is performed by forcibly moving lever arms.

Figure 9A:
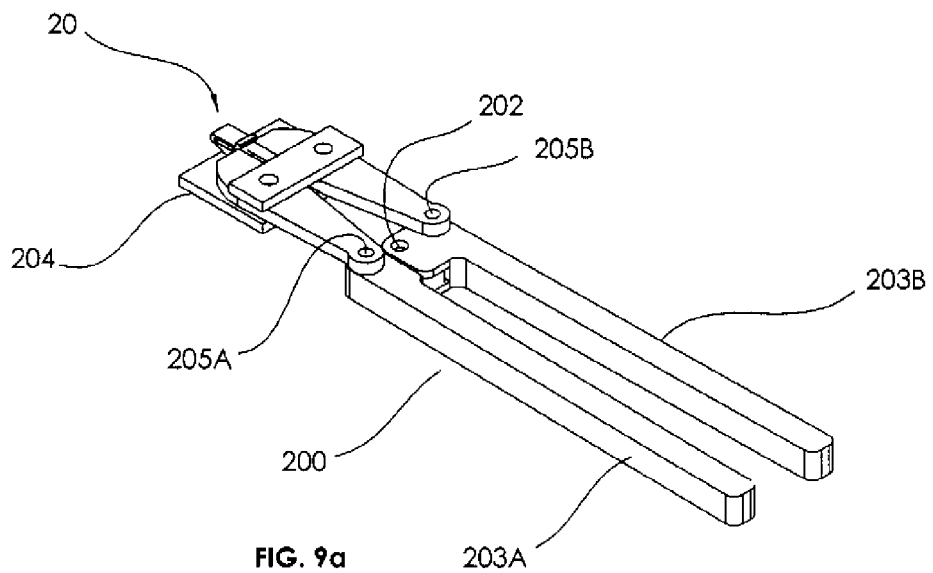
FIG. 9a is a perspective view of a bolt cutter style breaking tool
Figure 9B:
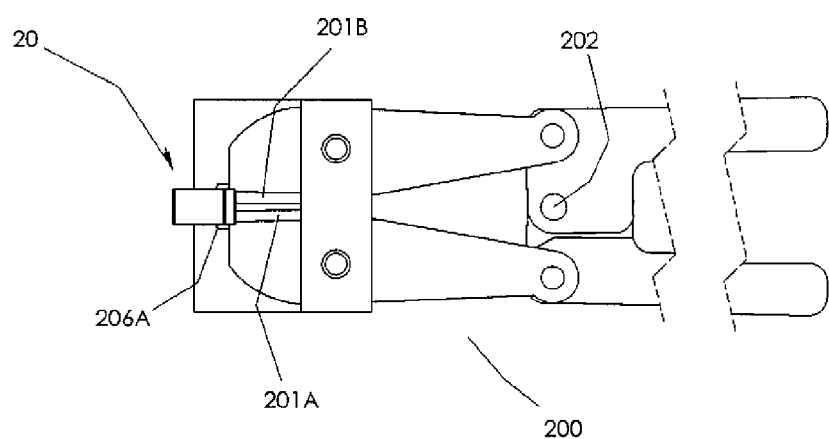
FIG. 9b is a top view of a bolt cutter style breaking tool

Referring to FIG. 9a and FIG. 9b, breaking tool 200 drives two wedge shaped blades 201 to cut arcuately across retainer 40 marking surface 49 from opposing ends 41a and 41b. This design is a modification of the common bolt cutter. The main modification is the locating member 204 and locating surface 206 that mate with retainer alignment member 46 to properly position and hold the part during operation. Lever arms 203 pivot about pin joint 202 and transfers forces from radial arms to blades at pin joint 205. Because the cutting occurs radially outside the band, blade travel distance does not be controlled to protect band.

Figure 10A:
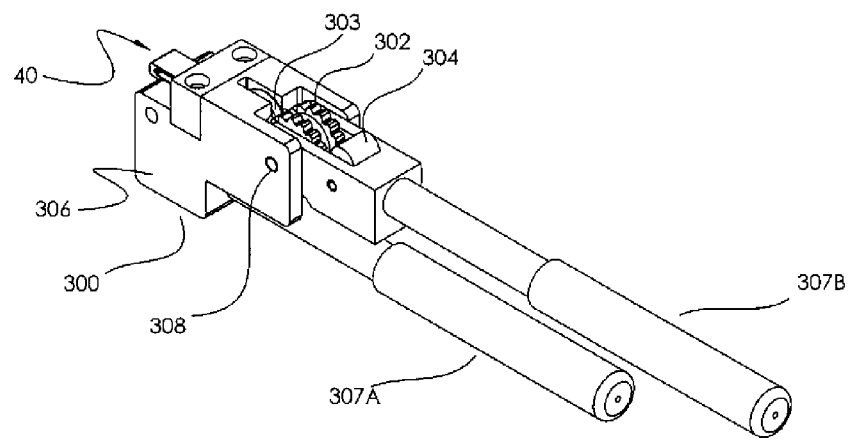
FIG. 10a is a perspective view of a ratchet style breaking tool
Figure 10B:
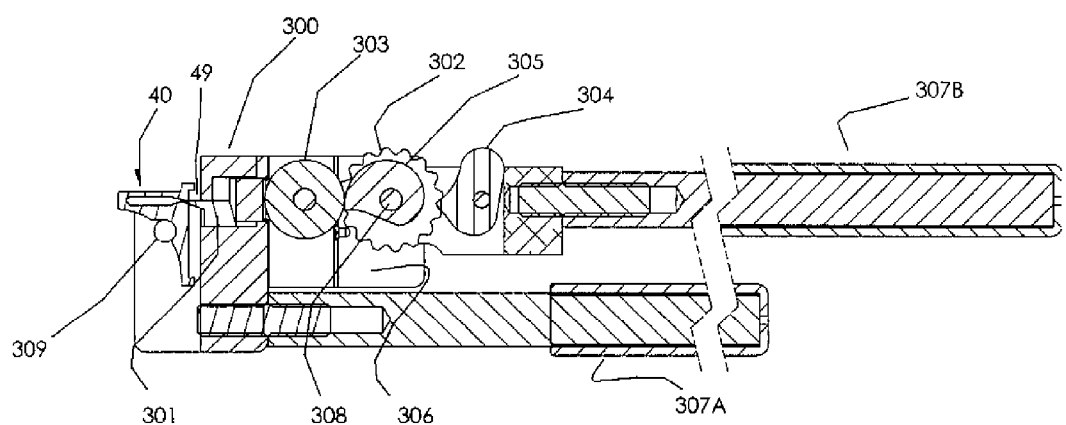
FIG. 10b is a cross sectional view of a ratchet style breaking tool

Referring to FIG. 10a and FIG. 10b, breaking tool 300 tool 300 drives a wedge shaped blade 301 into marking surface 49 of retainer 40 toward stress concentrating feature 46 until stresses exceed material strength of retainer causing a fracture and deformation that expands the surrounding aperture thus enabling disengagement of band connection. The blade 301 is propelled with a cam 305. Idle wheel 303 cancels moment forces of cam to efficiently transfer torque applied to ratchet gear 302 by way of pawl 304 and lever arms 307. In this embodiment, the cam 305 and ratchet gear 302 are fixedly attached with either pins, welds or fabricated as one part. Rotating components pivot about pin 308 supported by housing 306. The blade 301 cannot travel beyond the distance provided by the cam 305, which thus enables precise control of the blade to avoid damaging the band during breaking operation. Tool is properly aligned and mated with retainer 20 alignment member 48 with guiding mate pin 309, which also serves to hold part during breaking operation. The resulting break appearance is difficult to render without use of a specially constructed tool.

Figure 11A:
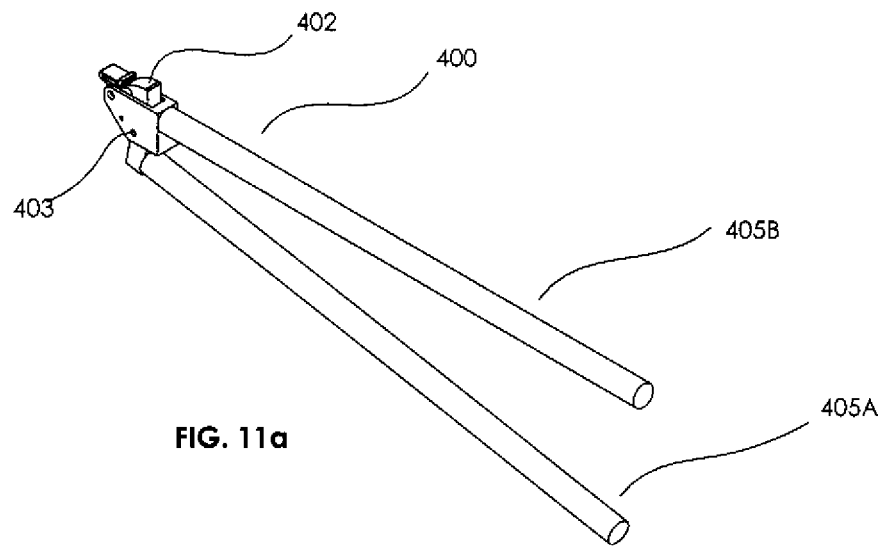
FIG. 11a is perspective view of a simple lever arm breaking tool
Figure 11B:
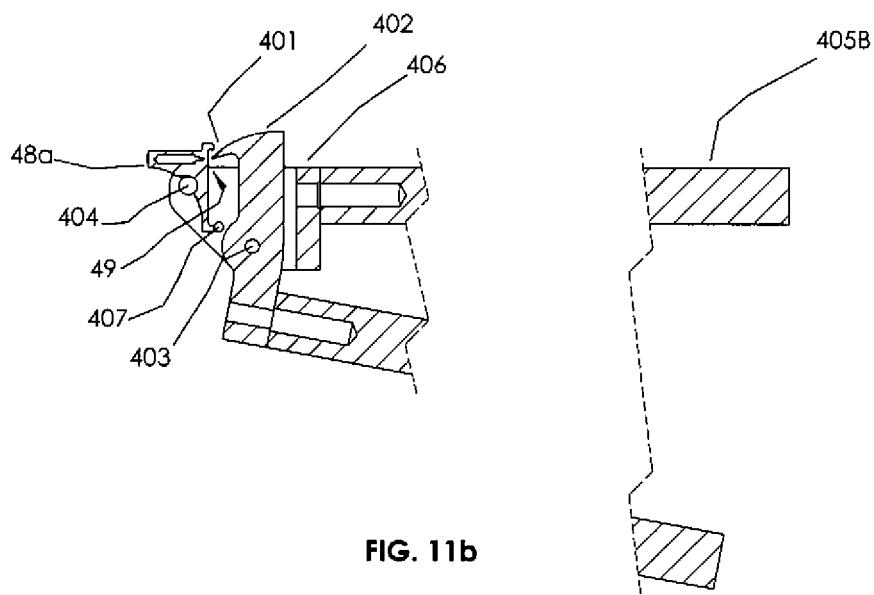
FIG. 11b is a cross sectional view of a simple lever arm breaking tool While the present invention will be described in connection with presently preferred embodiments, it will be understood that it is not intended to limit the invention to those embodiments. On the contrary, it is intended to cover all alternatives, modifications, and equivalents included within the spirit of the invention and as defined in the appended claims.

Referring to FIG. 11a and FIG. 11b, breaking tool 400 arcuately drives a wedge shaped blade 401 into marking surface 49 of retainer 40 toward stress concentrating feature 46 until stresses exceed material strength of retainer causing a fracture and deformation that expands the surrounding aperture thus enabling disengagement of band connection. The blade 401 may be integral or separate to pivot member 402 that rotates about pin 403 that is supported by housing 406. Lever arms 405 are attached to housing and pivot member to enable manual application of forces that transfer to the part. The locating member 404 mates with alignment member 48 on the retainer, for example shown in FIGS. 6a-6c In other example embodiments, FIGS. 6a-s illustrate multiple embodiments of a retainer (or retaining member where not fracturable). The various retainers will be useful for different applications in the field depending the type security requirements needed and will require greater or lesser resistance to tampering which is provided by various materials and geometry. The stress concentrating members of the various retainers comprise various geometries and features as provided herein, and will enable focusing of failure location in cooperation with a breaking tool. For example, stress concentrating members 41a-41f as described previously enable focusing of failure location in cooperation with breaking tool. Dimension 'c', as shown for example in FIG. 3b, depicts the thinnest location of material where cutting will occur. In an example embodiment, this feature is elongated to accommodate a scissor style cutter, which requires cutting to occur in a radial position outside the band to so the cutting blades can access the sides of retainer on which the blades will act. The guillotine style tools acts on the marking surface 44a of the retainer and can be radial inside the outside dimension of the band. When retainer is made with alloy steels, additional stress concentration features may be required in which case notches from sides 43*a* can also be provided. These notches 43*a* would also align with stress concentrating features 41*a*-41*f* and cutter of breaking tool. In an alternate embodiment, the face of the retainer also has a stress concentrating feature 42*a* to further reduce cutting forces required to break part.

In some retainer embodiments, the passageway has a hinge notch 48*a*-48*b* opposite the stress concentrating feature. This performs as hinge and facilitates spreading of the passageway after retainer has been broken to make it easier for operator to disconnect band for removal of band from meter. The triangular geometry of this feature minimizes ability of tampering to increase dimension 'a' by focusing any tampering forces to apex of triangle. Thus deformation prior to material failure occurs only in small region, thereby causing failure prior to intolerable increase of dimension 'a' (½ t) during deformation prior to material failure. In some embodiments the stress concentration feature 41*b*, 41*c*, is triangular or radial 41*a*, 41*d*, 41*e*, 41*f* with same design rational applied. When the stress concentrating feature on face side is non-triangular, the retainer requires more material around the stress concentrating feature to ensure deformation is minimized and stresses are properly focused.

In some retainer embodiments, a locating feature 48 is provided to facilitate proper positioning of breaking tool in relation to stress concentration feature 41*a*-41*f*.

Figure 7A:
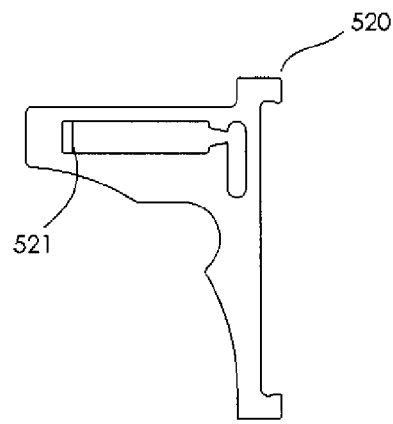
FIG. 7a is side view of an alternate embodiment of the retaining member
Figure 7B:
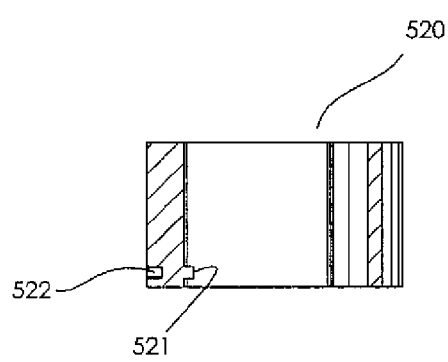
FIG. 7b is cross sectional view of an alternate embodiment of the retaining member
Figure 7C:
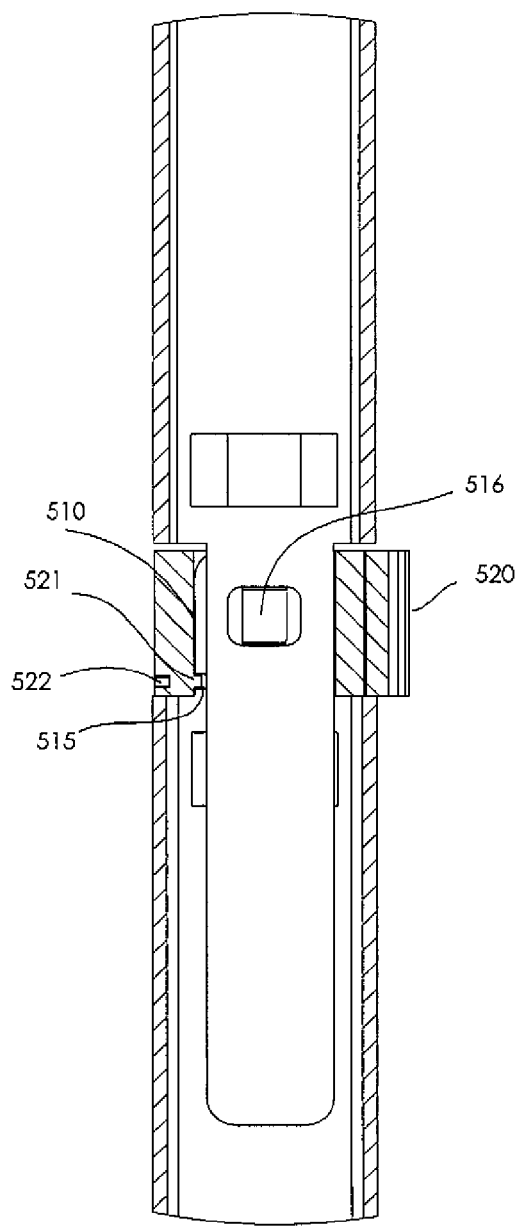
FIG. 7c is cross sectional view of an alternate embodiment of the band assembly

In other example embodiments, FIGS. 7*a*-7*c* show alternate embodiments of the assembly and components, the band and retainer. An example embodiment provides a means of affixing retainer 520 to the second tab 510 that cannot be undone without permanently altering one or both parts. The band alternate embodiment incorporates a notch 515 specifically located on tab 510 to align with a protuberance 521 internal to the passageway that may be introduced by means of an punch matching the shape of protrusion forcibly striking and causing retainer material to flow into notch cavity 515. This upsetting operation causes a visible cavity 522 where the punch entered the external surface of retainer 520 to cause the internal protrusion 521. FIG. 7*a* shows protrusion obscuring part of passageway. FIG. 7*b* shows cross section perspective protrusion. FIG. 7*c* provides same cross section view including both band tabs inside passageway and in a connected state.

The protuberance 521 and notch 515 may be necessary for customers experiencing installer corruption whereby installer defeats connector prior to installation. Alternate embodiments have the retainer attached to ring tab by means of welding, riveting or fastening. The retainer shrouds the catch 516 even in the disconnected condition and thereby prevents a user from flattening the catch 516 prior to closing. The possible catch 516 deflection remains within elastic deformation that would occur during normal operation.

Figure 8A:
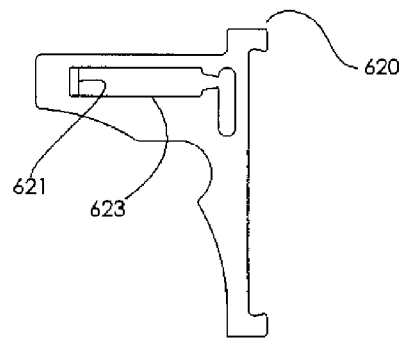
FIG. 8a is side view of an alternate embodiment of the retaining member
Figure 8B:
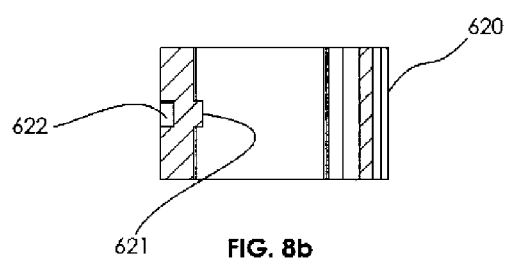
FIG. 8b is cross sectional view of an alternate embodiment of the retaining member
Figure 8E:
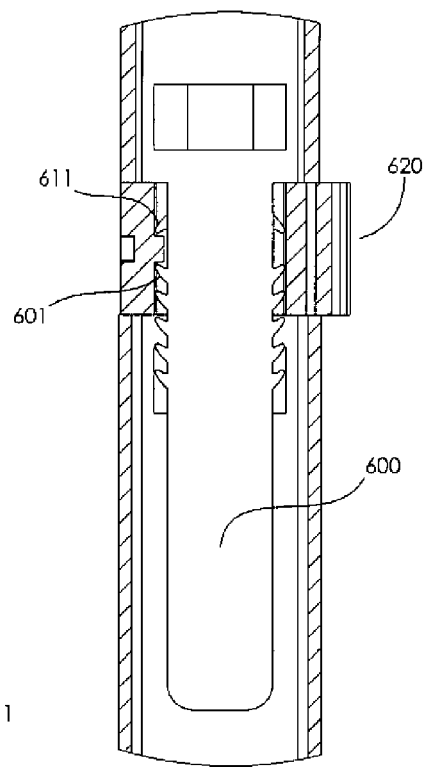
FIG. 8e is cross sectional view of an alternate embodiment of the band assembly
Figure 8C:
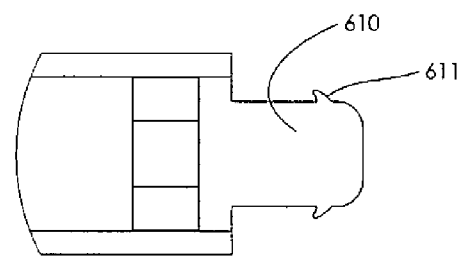
FIG. 8c is a top view of an alternate embodiment of the band tab one
Figure 8D:
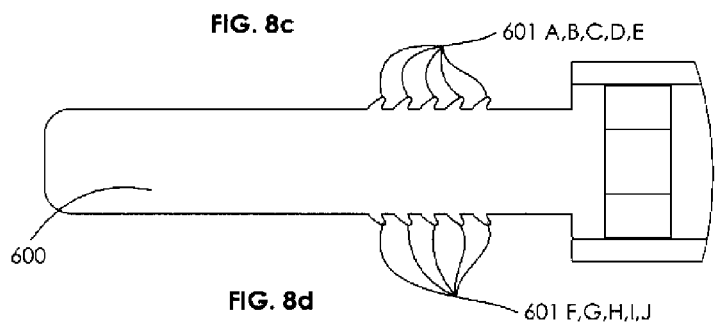
FIG. 8d is a top view of an alternate embodiment of the band tab two

FIGS. 8*a*-*c* shows an alternate means of connecting band and retainer. In this embodiment, shark teeth 601A,B,C,D,E, 601F,G,H,I,J and 611 of tabs 600 and 610, respectively, pass over an internal protuberance 621 within passageway 623. The internal protuberance 621 may be on one or two sides of passageway 623. In these set of figures, only one side protuberance 621 is depicted as a modification of retainer depicted. Two protuberances could be introduced on many of the retainer alternate embodiments. Geometry of shark teeth 601 and 611 are such that they will deflect when entering and passing over protuberance 623, but will not when moved in the exiting direction thus providing a connection that requires breaking the retainer 620 or shark teeth 611 and 601 to disconnect. FIG. 8*e* shows assembly in connected state both band tabs 610 and 600 inside passageway 623. Teeth 600 and 610 from respective tabs bear on internal protrusion(s) 621. Presented embodiment provides for adjustment by having multiple teeth on tab 600.

In an exemplary embodiment, to unlock the sealing ring, the tool breaks the fracturable retainer 40 along the stress concentrating feature 46. The dimension "c" along the stress concentrating feature 23 is dimensioned to let the force required to destroy the fracturable retainer be approximately 2000 lbs.

In various embodiments, FIG. 1 and FIG. 2 show the perspective views of the band assembly including the band 14 and the fracturable retainer 40 in the locked state. FIG. 3 shows the cross sectional view of the band assembly showing the mated tongues of the band 14 encapsulated by the fracturable retainer 40. The band 14 comprises of first tab or tongue 24 shown in FIG. 4 and second tab or tongue 30 shown in FIG. 5. FIG. 6*a* also shows the marking surface 69 on the fracturable retainer 40. The fracturable retainer fractures along the marking surface as shown in FIGS. 6*q* and 6*r* to leave a clear evidence of tampering. If the parts are made out of aluminum and color anodized, any tampering reveals the bright aluminum substrate or leaves a clear evidence of scratches or deformation. It also shows two protrusions 76A,76B that aid in holding a transparent shield to protect the identification data on the marking surface 69. A lens cover 47 is also provided in an embodiment to protect the display or marking surface or indicia. In an embodiment, the band consists of first tab at one end and second tab at the other end which mate when closed. The fracturable retainer 40 encapsulates the mating area of the two tabs of the band when closed. The fracturable retainer 40 needs to be destroyed using breaking tool to open the band. The breaking tool (also destroyer) is generally comprised of two actuating handles, a base member and pivoting member that are joined and communicate through a common fulcrum pin, and an actuating pin. Another embodiment of the present invention is to secure a watthour meter box sealing ring to a watthour meter box. Another embodiment is to provide a locking assembly that can be installed without special tools. Another embodiment is to provide a locking assembly that can be installed only one time. Another embodiment is to provide a locking assembly that when broken, cannot be reinstalled. Another embodiment is to provide a locking assembly that can be removed with a special lock removal tool. Another embodiment is to provide means to prevent the locking assembly removal without a special lock removal tool. Another embodiment is to provide a destroyer tool that when used to open or "unlock" a locking assembly, renders the locking assembly useless.

In an exemplary embodiment, the fracturable retainer 40 is fabricated using materials which are less ductile and have an elongation less than 2 percent so that they fracture along the stress concentrating feature. The materials selected have an ultimate tensile strength of 30 ksi to 75 ksi. Powder metals commonly have a brittle nature and very low elongation. Some powder metals such as 410SS and sinter hardened FLC 4608 are apt options as they yields these properties. Also, extruded aluminum grades 7075 or 6063 meet these specifications. Alternate embodiments which do not require the part to be less ductile and made out of metals with low ultimate tensile strengths and plastics can be an option for markets which are not highly security sensitive.

Figure 1A:
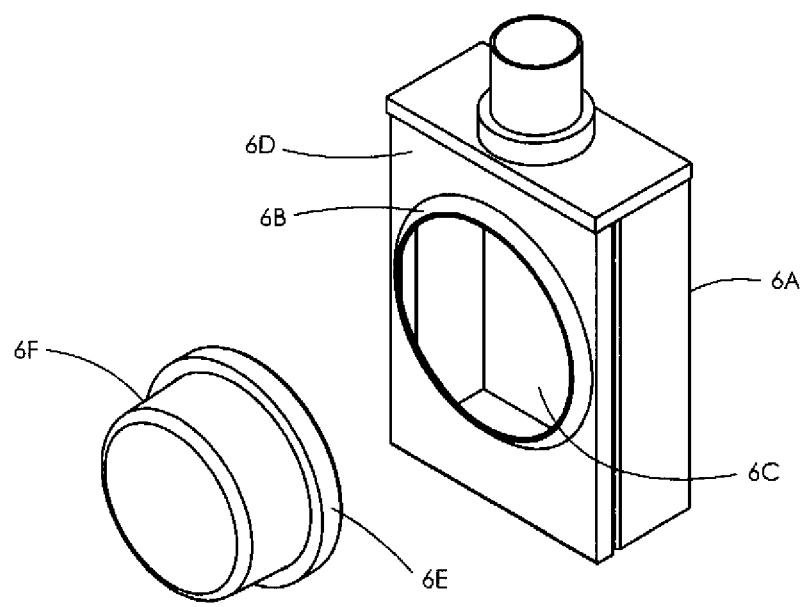
FIG. 1a is an exploded perspective view of a watt-hour meter enclosure and meter.
Figure 2A:
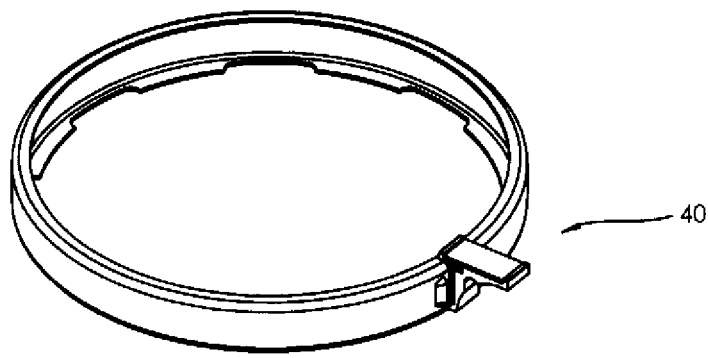
FIG. 2a is another perspective view of the band assembly, in the "locked" position
Figure 2B:
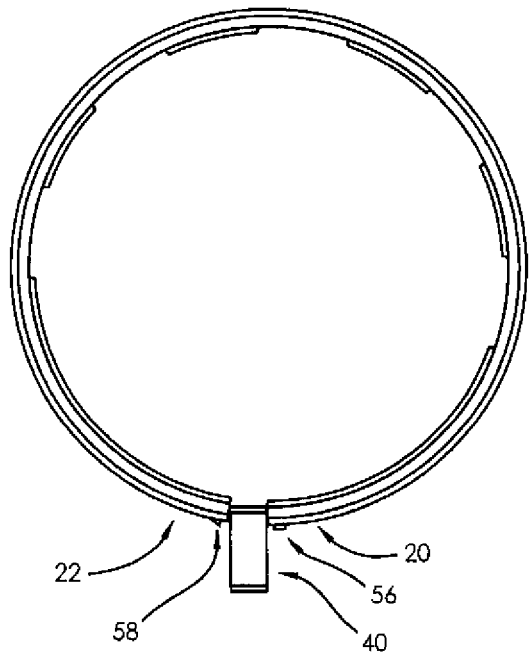
FIG. 2b is another perspective view of the band assembly, in the "locked" position

Turning again to the embodiment, as shown in FIGS. 1 and 2*a*-2*b*, it should be noted that in certain embodiments, an interior diameter of the annular band 14 is selected to fit around a watthour meter and socket box flange combination in accord with industry standards, for example, in accord with the industrial standard for watthour meters set by the American National Standards Institute ("ANSI"). In other embodiments, however, an interior diameter of the annular band is selected to secure electrical meters of non-standard or proprietary sizes that do not meet the ANSI industrial standards for watthour meters. The attached figures illustrate an apparatus for securing a plurality of structures. For example, in one embodiment, the apparatus is used for securing a watthour meter to a socket box (see FIG. 1b). The apparatus may also be used for creating a tamper-evident seal as will hereinafter be explained in further detail. According to a specific, non-limiting embodiment of the invention, and referring again to FIGS. 1-1b, an apparatus for securing a watthour electrical meter to a socket box cover comprises an annular band, a body portion of which is divided to comprise opposed ring ends as noted above. According to one example embodiment, annular band is formed from a metallic material to be discussed in further detail herein. In another embodiment, the annular band, including the first and second tabs, is extruded from a metal strip and has a single piece construction. In a further embodiment, the band material is rolled into the shape of an annular band. In a still further embodiment, the band is extruded from a solid rod. In other embodiments, the annular band is formed from a composite material, for example, from a hardened resin. In still other embodiments, the annular band is formed from plastic. Referring now to FIG. 1a-1c, there is shown a securing sealing ring 12 for a ringed-type meter box. As noted earlier, in order to hold a meter in place and prevent its removal from the meter box, both the meter and meter base incorporate a corresponding set of flanges that are retained together with the annular, lockable sealing ring 12. The lockable sealing ring 12 is designed to encase and captivate the corresponding flanges of the meter and base when the ends 20, 22 of the sealing ring are held or connected together. It should also be noted that the contour of the band conforms with the meter band, rather than having tabs extending radially outward which could foster tampering and the like.

It should be understood that while descriptions and application representations apply to meter boxes, these devices could be used on many enclosures of similar configuration and design that may contain wires or other valuable material that must be protected from theft or tampering. Such applications may include traffic light enclosures, substation enclosures or the like.

It should be noted that the design described does not limit the scope of the embodiments of invention; the number of various elements may change, or various components may be added or removed to the above-described concept.

The foregoing disclosure and description of embodiments of the invention is illustrative and explanatory of the above and variations thereof, and it will be appreciated by those skilled in the art, that various changes in the design, organization, order of operation, means of operation, equipment structures and location, methodology, the use of mechanical equivalents, such as different types of components than as illustrated whereby different steps may be utilized, as well as in the details of the illustrated construction or combinations of features of the various elements may be made without departing from the spirit of the embodiments of the invention. As well, the drawings are intended to describe various concepts of embodiments of the invention so that presently preferred embodiments of the invention will be plainly disclosed to one of skill in the art but are not intended to be manufacturing level drawings or renditions of final products and may include simplified conceptual views as desired for easier and quicker understanding or explanation of embodiments of the invention. As well, the relative size and arrangement of the components may be varied from that shown and the embodiments of the invention still operate well within the spirit of the embodiments of the invention as described hereinbefore and in the appended claims. Thus, various changes and alternatives may be used that are contained within the spirit of the embodiments of the invention. It is therefore desired that the invention not be limited to these embodiments, and it is intended that the appended claims cover all such modifications as fall within the true spirit and scope of the invention.

Accordingly, the foregoing specification is provided for illustrative purposes only, and is not intended to describe all possible aspects of the example embodiments of the invention. It also will be appreciated by those skilled in the art, that certain various changes in the ordering of steps, ranges, interferences, spacings, components, hardware, and/or attributes and parameters, as well as in the details of the illustrations or combinations of features of the methods and system discussed herein, may be made without departing from the spirit of the embodiments of the invention. Moreover, while various embodiments of the invention have been shown and described in detail, those of ordinary skill in the art will appreciate that changes to the description, and various other modifications, omissions and additions may also be made without departing from either the spirit or scope thereof.

What is claimed is:

1. An apparatus for securing an electrical meter to a meter socket box, the apparatus comprising:
    an annular band, wherein a body portion of the annular band comprises a first band portion and a second band portion, and wherein the first band portion comprises a first ring end and the second band portion comprises a second ring end;
    wherein a first tab is disposed on the first ring end, the first tab comprising a connector member comprising a thickness;
    wherein a second tab is disposed on the second ring end, the second tab comprising a receiver member comprising a thickness, and wherein the connector member is adapted for connection with the receiver member; and
    a fracturable retainer comprising a body and a defining a passageway defined by the body, wherein the passageway receives at least a portion of the connector member and the receiver member when the connector member and the receiver member are connected, and wherein the passageway is sized to accommodate the thickness of the connector member and the thickness of the receiver member through the entire passageway, wherein the body inhibits access to at least the connector member or receiver member.

2. The apparatus of claim 1, wherein the fracturable retainer is adapted to indicate evidence of tampering with the fracturable retainer.

3. The apparatus of claim 1, wherein the fracturable retainer comprises an outer surface adapted to receive at least one fracturing force by an external object and wherein the fracturable retainer further comprises a region adapted to fracture in response to the at least one fracturing force.

4. The apparatus of claim 3, wherein the fracturable retainer may be removed from the annular band after fracturing.

\* \* \* \* \*